United States Patent [19]
Sato

[11] Patent Number: 5,640,102
[45] Date of Patent: Jun. 17, 1997

[54] PIN TEST CIRCUIT FOR SEMICONDUCTOR TEST SYSTEM

[75] Inventor: Kazuhiko Sato, Gyoda, Japan

[73] Assignee: Advantest Corporation, Tokyo, Japan

[21] Appl. No.: 577,269

[22] Filed: Dec. 22, 1995

[30]  Foreign Application Priority Data

Dec. 22, 1994 [JP] Japan .................................. 6-336074

[51] Int. Cl.$^6$ .............................. G01R 31/28; G01R 1/04; H05K 1/05
[52] U.S. Cl. ......................................... 324/755; 324/158.1
[58] Field of Search .............................. 324/73.1, 158.1, 324/755

[56]  References Cited

U.S. PATENT DOCUMENTS 4,724,379  2/1988  Hoffman .............................. 324/158.1
5,386,199  1/1995  Nishimura et al. ................... 324/158.1

*Primary Examiner*—Kenneth A. Wieder
*Assistant Examiner*—Barry C. Bowser
*Attorney, Agent, or Firm*—Knobbe, Matens, Olson & Bear, LLP

[57]  ABSTRACT

The present invention provides a cost effective and compact pin test circuit for non-connection pins of the semiconductor device under test. The pin test circuit includes a plurality of exclusive DC channels each of which has a flirt relay controlled by a control signal for switching ON/OFF a power source which generates a predetermined voltage, and a second relay controlled by a control signal switching ON/OFF a fixed electric potential such as a ground level electric potential. The exclusive DC channel is used for the NC pin testing and connected to each of the NC pins which are divided into two groups. The exclusive DC channels are used to determine whether or not the NC pins form an electrical short circuit each other by connecting one NC pin to a ground level and while connecting the other NC pin to the power source having the DC measurement function.

2 Claims, 3 Drawing Sheets

PIN TEST CIRCUIT FOR SEMICONDUCTOR TEST SYSTEM

FIELD OF INVENTION

The present invention relates to a pin test circuit for a semiconductor test system having exclusive DC test channels for measurement of no-connection pins of a semiconductor device under test.

Background of the Invention

No-connection (NC) pins are sometimes found in a semiconductor device that is to be tested by a semiconductor test system because of the relationship between the needs of the standard number of pins for a packaged device and the actual number of signal terminals incorporated in a micro chip in the packaged device. The NC pins are usually considered to be empty pins that are not connected to any circuit components in the device.

In testing a semiconductor device having such NC pins, the NC pins are usually tested as well as signal pins. This is because the semiconductor device do not work correctly when the device is mounted on a circuit board and the NC pins are connected to the power source or the ground (GND) if the NC pins includes a failure such as a short circuit formed with each other.

In the conventional method, such failures in the NC pins are checked by using test channels in the semiconductor test system. As is well known in the art, a semiconductor test system includes a large number of test channels, 500 channels for example, each of which corresponds to a pin of the semiconductor device to be tested. Each of the test channels includes a circuit configuration having a wave formatter to form a desired waveform such as a return to zero or non-return to zero waveform of a test signal, a driver to determine an amplitude and threw rate of the test signal to be supplied to the device under test, a comparator to compare the signal from the device under test with an expected data signal, and a power source that measures a DC function of the device under test. The NC pin is checked by these test channels to confirm that it is an open circuit and thus not connected to any other NC pins.

FIG. 2 shows a circuit configuration for testing NC pins in the conventional test system wherein Dr designates a driver, Cp designates a comparator and DC1 designates a power source which can also measure a DC current flowing therefrom. An examples of test procedure in the conventional test method to determine whether NC pins are connected to each other or not is as follows with reference to FIG. 2:

1) Output 0 V level signal from the driver to a test channel 21 which is connected to a non-connection pin NC1 of a semiconductor device 10 to be tested.

2) Apply a predetermined DC voltage by a power source DC1 to a test channel 22 connected to a non-connection pin NC2 and measure an electric current flowing from the test channel 22 to the pin NC2. If the pins NC1 and NC2 are short-circuited each other, an electric current will be detected by the power source DC1. In contrast, if the pins NC1 and NC2 do not form a short circuit, no electric current will be detected.

The conventional method using the test channels of the semiconductor test system to test the NC pins as noted above is associate with the following disadvantages:

1) Since the test channels are used only to see whether the NC pins are open or short-circuited, the ability of the test channels is not fully used. In other words, the test channel which is designed to provide a dynamic test signal with variable waveform, timing and amplitude is occupied by a DC test which merely checks an open-short circuit.

2) Since the test channels are used for testing the NC pins, an overall number of test channels available for testing signal pins of the device will be decreased. Thus, for example, the maximum number of pins of a semiconductor device that can be tested will be decreased. Further, a maximum number of semiconductor devices possible for a simultaneous test will be limited. Therefore, the conventional method tends to decrease a test efficiency of the semiconductor test system.

3) Increasing the number of the test channels will not solve this problem because the cost and size of the test system will increase accordingly.

Thus, there is a need in the semiconductor test industry for a more convenient test system having a pin test circuit for effectively testing the non-connection pins of the semiconductor device without decreasing the ability of the other circuits in the test system.

SUMMARY OF THE INVENTION

Therefore, it is an object of the present invention to provide a pin test circuit for a semiconductor test system which is capable of effectively testing non-connection (NC) pins of a semiconductor device under test with low cost without increasing the size of the test system.

It is another object of the present invention to provide a pin test circuit for a semiconductor test system which is capable of testing the NC pins without decreasing the ability of the other circuits in the test system.

In order to achieve the above object, the pin test circuit of the present invention includes exclusive DC channels each of which consists of a first relay controlled by a control signal for switching ON/OFF an output of a DC power source having a DC measurement function, and a second relay controlled by a control signal for switching ON/OFF a fixed electric potential such as a ground level electric potential.

In the pin test circuit of the present invention noted above, the NC pins are tested by the exclusive DC channels of the test system. Each of the exclusive DC channels is connected to corresponding each of the NC pins which are separated into two groups. According to this arrangement of the present invention, it is possible to check whether or not the NC pins are electrically connected with each other by connecting one group of the DC channels to the fixed electric potential such as a ground level potential while connecting the other group of the DC channels to the power source having the DC measurement function.

Further, according to the present invention, the resources of the semiconductor test system can be effectively used by separately providing the DC channels for testing the NC pins of the device under test. This is because, in the present invention, the exclusive DC channels can be allocated to the NC pin testing while the test channels are allocated to the signal pin testing.

DETAILED DESCRIPTION OF THE PRESENT INVENTION

Figure 1:
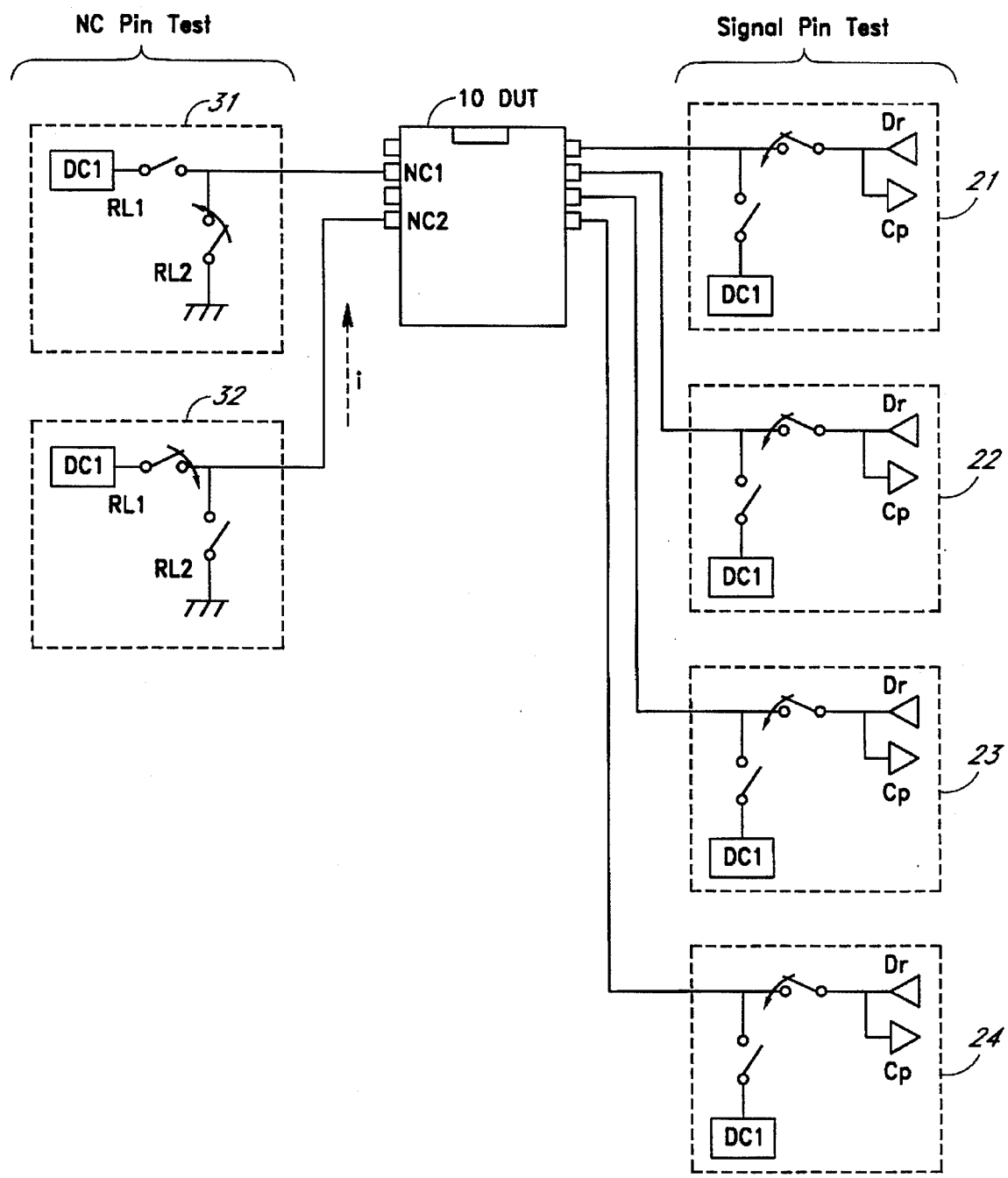
FIG. 1 is a block diagram showing a structure of a first embodiment of the pin test circuit of the present invention having exclusive DC channels for testing no-connection pins of the device under test.

FIG. 1 shows the first embodiment of the present invention. In the present invention, DC channels for exclusive use in DC tests of a semiconductor device including a test of a no-connection (NC) pins are provided separately from other test channels in a semiconductor test system. As shown in FIG. 1, in testing the NC pins, each of the DC channels is connected to the corresponding NC pin of the semiconductor device to be tested.

Each of the exclusive DC channels (31, 32) consists of a relay (RL1) controlled by a control signal for switching ON/OFF a power source (DC1) having a DC measurement function to a NC pin, and a relay (RL2) controlled by a control signal for switching ON/OFF a fixed electric potential such as a ground level electric potential. Although only two DC channels are shown in the drawings of the present invention, for the purpose of simplicity, many such DC channels can be provided in an actual test system.

For testing whether the NC pins are connected with each other in this arrangement, the procedure similar to the conventional method is carried out as follows:

1) Control the relay (RL2) of the exclusive DC channel 31 to be closed so that the pin NC1 is set to the ground level electric potential while the relay (RL1) of the DC channel 31 is controlled to remain open.
2) Control the relay (RL1) of the exclusive DC channel 32 to be closed so that the pin NC2 is provided with the output voltage of the power source (DC1) having the DC measurement function. The relay (RL2) of the DC channel 32 is controlled to remain open.
3) Then, measure an electric current flowing from the power source (DC1) to the pin NC2.

If there is a short circuit between the pin NC1 and the pin NC2, an electric current flowing in the pin NC2 will be detected by the power source DC1. In contrast, if the pins NC1 and NC2 are open with each other, no current will flow from the power source (DC1). Therefore, the non-connection pins NC1 and NC2 are effectively tested by the arrangement of FIG. 1.

Figure 3:
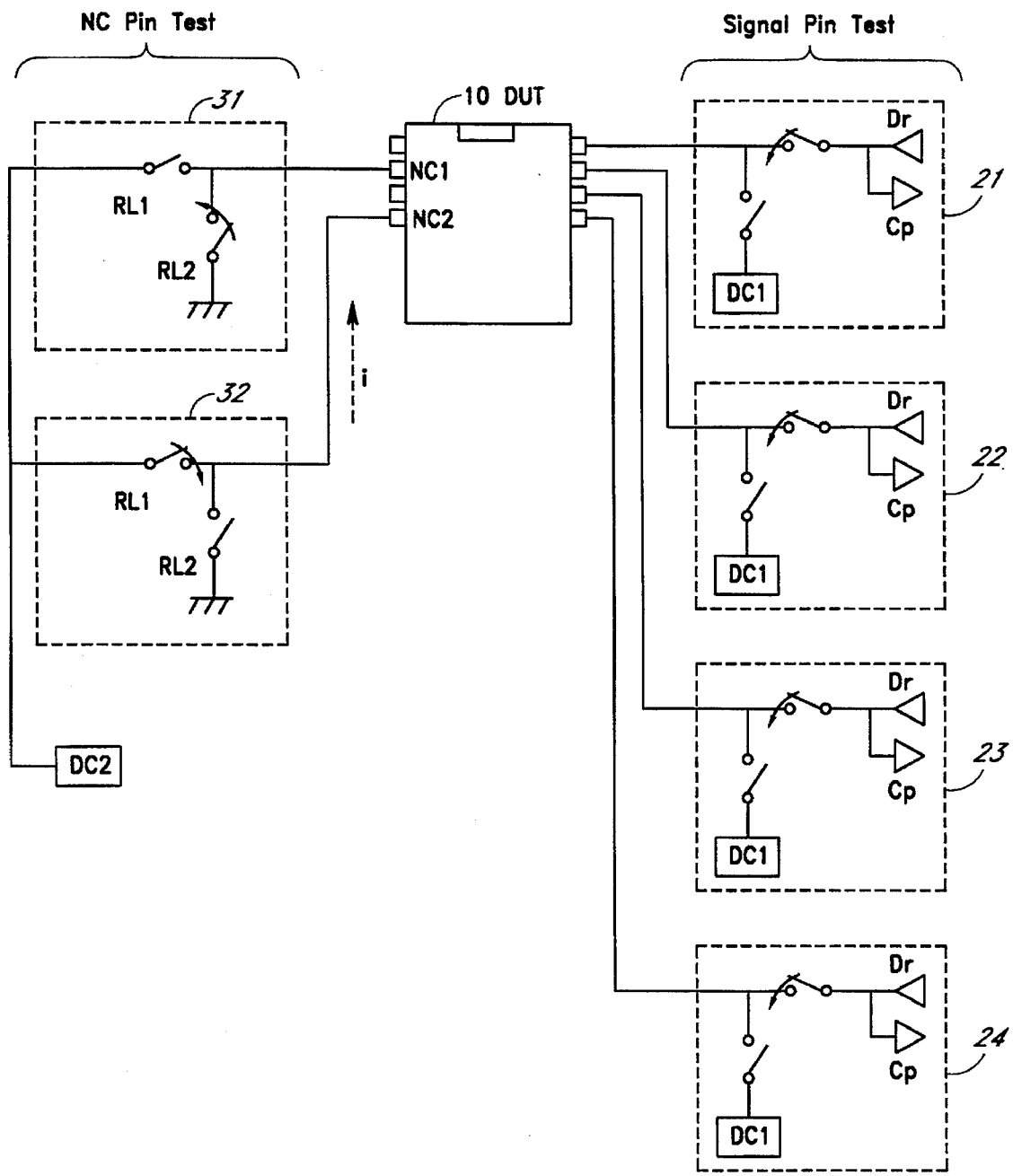
FIG. 3 is a block diagram showing a structure of a second embodiment of the pin test circuit of the present invention using the exclusive DC channels.

FIG. 3 is a block diagram showing the second embodiment of the present invention having exclusive DC channels for testing the NC pins of the semiconductor device. In the second embodiment, a power source (DC2) having a DC measurement function is provided outside of two or more exclusive DC channels (31, 32). Namely, in this example, only one power source (DC2) having the DC measurement function is provided for both of the exclusive DC channels (31, 32) to supply DC voltages to the DC channels. It is also possible to selectively provide a plurality of the power sources (DC2) having the DC measurement function for per each exclusive DC channel (31, 32).

In the foregoing embodiments of the present invention, the power sources (DC1, DC2) are shared by each DC channel corresponding to the non-connection pins of the device under test (10), and the connection of the power source to the corresponding exclusive DC channel is established by controlling the switching operation of the relay (RL1) in each channel.

Further, since the NC pins are tested by selecting two NC pins when the semiconductor device is mounted on a socket, only two exclusive DC channels for testing the NC pins may be allocated for the two NC pins. In this arrangement, a short circuit between the selected two NC pins is checked first and then a short circuit for the next two NC pins is tested. Like this manner, all the remaining NC pins will be tested with the use of only two DC channels by sequentially testing two NC pins in a step by step manner. Alternatively, a large number of DC channels can be provided in the pin test circuit to test a large number of NC pins at the same time.

Figure 2:
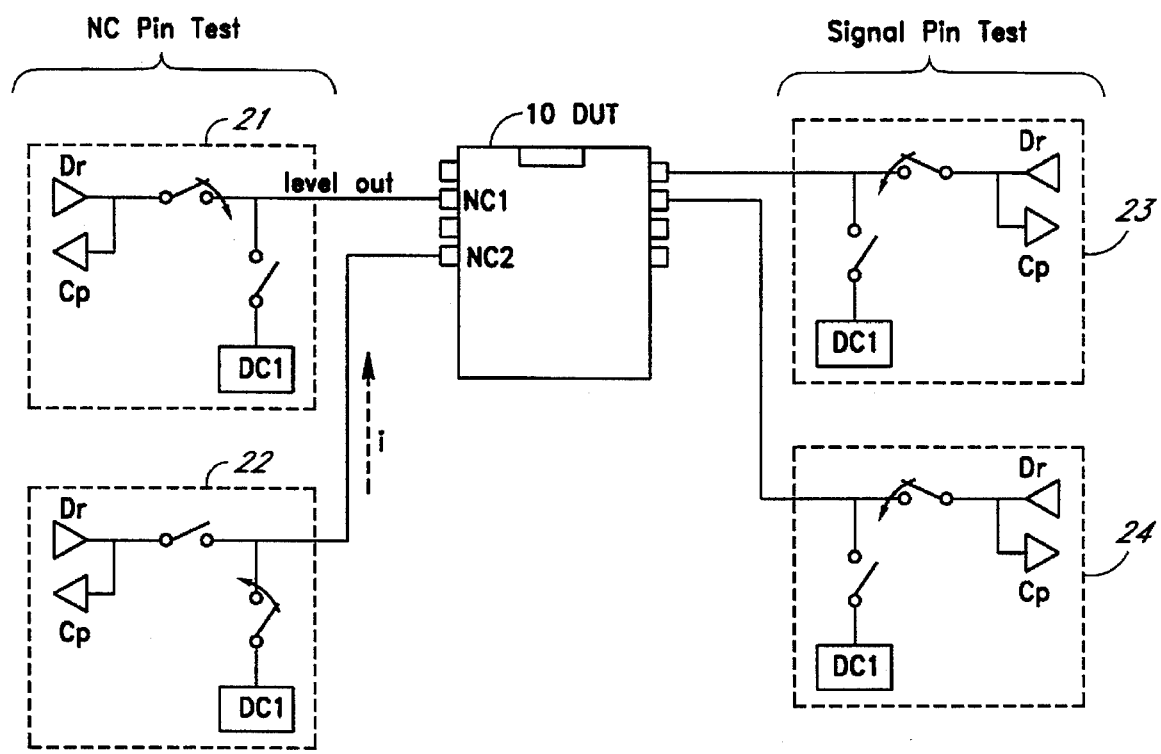
FIG. 2 is a block diagram showing a circuit configuration for testing the no-connection pins of the device under test in the conventional test method.

As has been foregoing, according to the present invention, the resources of the semiconductor test system can be effectively used by providing the DC channels for testing the NC pins of the device under test. In the conventional method shown in FIG. 2, the test channels (21, 22) are allocated in the NC pin testing. Since the test channels are designed to be used for more complicated testing by having the wave formatters, drivers and comparators, the use of the test channels for the NC pin testing lowers the test efficiency in the semiconductor test system. In the present invention, however, the exclusive DC channels (31, 32) are allocated instead so that the test channels (21, 22) can be used solely for the signal pin testing.

In summary, the present invention as described in the foregoing provides the following effects:

1) Because the exclusive DC channels are used for testing the NC pins of the semiconductor device under test, the capability of the tester channels in the test system is not affected by the NC pin testing.
2) When the device is tested, neither the number of test channels used for the signal pin testing nor the number of device under test in the simultaneous testing are decreased. Therefore, the test efficiency for the signal testing remains unchanged while the NC pin testing can be separately performed, which increases an overall test efficiency.
3) The exclusive DC channel has a simple structure that allocates the power source having the DC measurement function which is provided for the device under test by controlling the relay. Thus, it can be easily realized without increasing the manufacture cost or size of the semiconductor test system.

I claim:

1. A pin test circuit for a semiconductor test system having a plurality of tester channels (21, 22, 23, 24) connected to a device under test (10), comprising:
   a first DC channel (31) connected to a first non-connection pin (NC1) of said device under test (10);
   a second DC channel (32) connected to a second non-connection pin (NC2) of said device under test (10);
   wherein each of said first and second DC channels comprising:
   a first relay (RL1) controlled by a control signal for switching ON/OFF a power source (DC2) which generates a predetermined voltage and having a DC measurement function, and a second relay (RL2) controlled by a control signal for switching ON/OFF a fixed level electric potential.

2. A pin test circuit for a semiconductor test system having a plurality of tester channels (21, 22, 23, 24) connected to a device under test (10), comprising:
   a first DC channel (31) connected to a first non-connection pin (NC1) of said device under test (10);
   a second DC channel (32) connected to a second non-connection pin (NC2) of said device under test (10);
   a power source (DC2) for generating a predetermined voltage and having a DC measurement function;
   wherein each of said first and second DC channels comprising:
   a first relay (RL1) controlled by a control signal for switching ON/OFF said power source (DC2) having said DC measurement function;
   a second relay (RL2) controlled by a control signal for switching ON/OFF a fixed level electric potential.

* * * * *